United States Patent [19]

Chitre

[11] 4,401,840
[45] Aug. 30, 1983

[54] SEMICRYSTALLINE SOLAR CELL

[75] Inventor: Sanjeev R. Chitre, Tempe, Ariz.

[73] Assignee: Photowatt International, Inc., Tempe, Ariz.

[21] Appl. No.: 285,787

[22] Filed: Jul. 22, 1981

[51] Int. Cl.³ .................... H01L 31/06; H01L 31/18
[52] U.S. Cl. ............................. 136/258; 136/256; 29/572; 29/590; 29/591; 357/30; 357/59; 156/647; 156/648; 156/662; 427/74; 427/88; 427/92; 427/307; 204/15; 204/32 R; 204/38 B
[58] Field of Search ................. 136/256, 258 PC; 357/30, 59; 204/15, 32 R, 38 B; 156/647, 648, 662; 427/74, 88, 92, 307; 29/572, 580, 590, 591

[56] References Cited

U.S. PATENT DOCUMENTS

| 2,588,254 | 3/1952 | Lark-Horovitz et al. | 136/249 |
| 4,171,997 | 10/1979 | Irmler | 148/187 |
| 4,197,141 | 4/1980 | Bozler et al. | 136/258 |
| 4,249,957 | 2/1981 | Koliwad et al. | 136/258 |
| 4,320,168 | 3/1982 | Lindmayer | 428/332 |
| 4,366,338 | 12/1982 | Turner et al. | 136/258 PC |

OTHER PUBLICATIONS

G. W. Turner et al., "Efficient Large-Grained GaAs Homojunction Solar Cells", *Conf. Record, 14th IEEE Photovoltaic Specialists Conf.* (1980), pp. 1330-1332.

K. P. Pande et al., "The Preparation & Properties of Thin Polycrystalline GaAs Solar Cells With Grain Boundary Edge Passivation", *IEEE Trans. Electron Devices,* vol. Ed-27, pp. 635-640 (1980).

S. S. Chu et al., "Thin Film GaAs Solar Cells With Reduced Film Thickness", *Conf. Record, 15th IEEE Photovoltaic Specialists Conf.* (1981), pp. 1310-1315.

*Primary Examiner*—Aaron Weisstuch
*Attorney, Agent, or Firm*—Wallenstein, Wagner, Hattis, Strampel & Aubel

[57] ABSTRACT

A solar cell is provided which utilizes a semicrystalline semiconductor starting material. The solar cell has a metallic layer deposited over the grain boundaries between adjacent active grain areas of the material to collect the current generated in the grain areas. The metallic layer also shields the grain boundaries from illumination, thereby passivating the boundaries.

22 Claims, 5 Drawing Figures

SEMICRYSTALLINE SOLAR CELL

BACKGROUND OF THE INVENTION

1. Field of the Invention

The present invention relates to solar cells, and more particularly, to solar cells having a semicystalline structure. An inexpensive solar cell is provided which can be constructed in large sections or grains and has a conductor network specifically located over the grain boundaries of the semicrystalline material.

2. Description of the Prior Art

Solar cells are generally constructed of a semiconductor material which converts incident radiation such as sunlight to electricity. This process is often referred to as photovoltaic conversion. The semiconductor material is often a wafer of "single crystal" silicon which has a single crystalline structure of a particular orientation throughout the wafer. The wafer is doped with impurities to form a p-n junction. A metal grid is usually deposited on the surface of the wafer to collect the electricity that is generated. The metal grid typically covers from 8 to 11% of the surface depending upon the size of the wafer. Since the entire wafer area of a single crystal solar cell is active, that is, participates in the photovoltaic conversion, the metal grid covering the surface shields active area from the incident radiation. This contributes to lowering the achievable efficiency of the solar cell.

Furthermore, single crystal silicon is relatively expensive and is limited in shape and size. Wafers of single crystal silicon are sliced from round ingots which generally do not exceed 10 centimeters in diameter. A less expensive material is semicrystalline silicon which can be cast in much larger rectangular ingots. A semicrystalline wafer has several grain areas each of which has a particular crystalline orientation or grain which usually differs from neighboring grain areas. The crystal grain areas are separated by grain boundaries which are discontinuities in the silicon crystalline structure. The term semicrystalline is meant here to encompass what is also commonly called polycrystalline.

Although less expensive than single crystal solar cells, prior attempts to construct cells from semicrystalline material have experienced several difficulties. First, the grain boundaries are inactive and therefore do not contribute to the photovoltaic generation of electricity. Thus, a semicrystalline solar cell has less active area than a single crystal cell of equivalent size.

In addition, when the semicrystalline wafer is doped with impurities to form the p-n junction, the grain boundaries have a tendency to become doped to a deeper level and to a greater degree than the grain areas. This usually causes shorting or leakage to occur across the p-n junction. Also, because of the discontinuous structure of the grain boundary, the carriers generated by the cell can recombine more easily in the grain boundaries so that the grain boundaries can act as a current sink. Furthermore, it has been found that incident sunlight on the grain boundaries further increases the recombination rate in the grain boundary.

Attempts have been made to passivate the grain boundary by the use of monoatomic hydrogen or other techniques to prevent the grain boundary from acting as a current sink or short. However, these studies have not provided a highly practical process or processes which can be used to produce solar cells using semicrystalline material in large volumes in a manufacturing environment utilizing state of the art technology.

SUMMARY OF THE INVENTION

It is an object of the present invention to provide a semicrystalline solar cell having improved efficiency.

It is another object of the present invention to provide a semicrystalline solar cell which minimizes the recombination of carriers in the grain boundaries and reduces shorting across the p-n junction.

It is still another object of the present invention to provide a conductor metallization technique which minimizes the shadowing of active areas of the semiconductor material.

A preferred embodiment of the present invention provides a semicrystalline solar cell having grain boundaries which are etched with an anisotropic agent and are displaced by a metal such as copper. The displacing metal combines with ununited bonds of the grain boundary surfaces to reduce minority carrier recombination in the grain boundaries.

The solar cell has additional metal deposited in the grain boundaries to form a grain boundary conductor to collect carriers generated in the grain areas before the carriers can recombine in the grain boundaries. This reduces the amount of current lost through current sinking in the grain boundaries. In addition, the grain boundary conductor network significantly reduces the amount of active areas shadowed by conventional metal grid conductor techniques. Furthermore, the metal on the grain boundaries shields the boundaries from light, which reverse biases the p-n junction at each boundary which further passivates the boundaries, as will become more clear in the following detailed discussion.

Accordingly, an inexpensive solar cell is provided which can be constructed in large rectangular sections or square ingots rather than small round wafers. Furthermore, the cell does not have a conventional grid conductor network but instead has the cell conductors specifically located over the grain boundaries which are otherwise inactive and act as current sinks. Thus a very useful solar cell may be constructed from material previously useless, as a practical matter, for solar cell fabrication.

DETAILED DESCRIPTION OF THE DRAWINGS

A preferred embodiment of the present invention utilizes cast semicrystalline silicon as the starting material for the solar cells of the present invention. It is recognized, however, that the starting material may be any semicrystalline semiconductor material. The starting material typically has a resistivity of 5–10 ohm-centimeters and is cut into square wafers.

Figure 1:
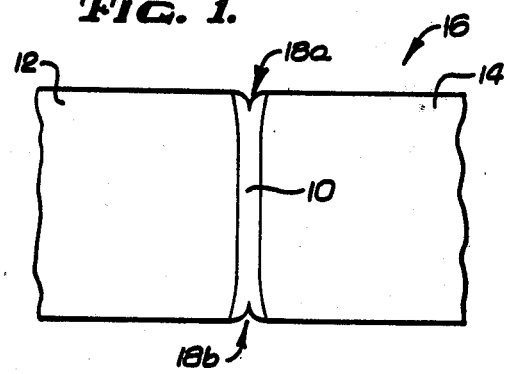
FIG. 1 is a schematic representation of a cross-section of a grain boundary between two grain areas of a semicrystalline wafer after preliminary etching.

FIG. 1 shows an exaggerated cross-section of a grain boundary 10 between two grain areas 12 and 14 of a wafer 16 of starting material. The wafer 16 is typically 20 mils thick with the average size of the grain areas generally being somewhat larger than 2 square centimeters. Grain area 12 has a single crystalline orientation or grain which, in the illustrated embodiment, differs from the crystalline orientation of the grain area 14. The predominant orientation of the grain areas is typically [110].

The grain boundary 10 is a transition region between the crystalline orientation of the grain area 12 and the orientation of the grain area 14. A single crystal starting material has a regular crystalline lattice and therefore does not have any grain boundaries since there is a single continuous grain throughout the material. The grain boundaries are generally less dense than the single crystal grain areas of a semicrystalline material.

The wafer 16 often initially has saw marks and organic substances on the surface. An ultrasonic degreaser which utilizes recirculating freon may, for example, be used to remove wax and other organic substances from the wafer. The wafers are typically dry when removed from the degreaser.

A solution of 20% concentrated sodium hydroxide may be used to remove the saw marks and other damage and also to define the grain boundaries. The rate of etching is faster at the grain boundary 10 than on the grain areas 12 and 14 so that approximately ½ mil of silicon is etched off each side of the grain boundary 10 as indicated at 18a and 18b in FIG. 1. This is a preliminary etching step which exposes the differing orientations of the crystal grains of the grain areas 12 and 14 at the grain boundary 10. Any traces of the sodium hydroxide remaining may be eliminated by a prediffusion cleaning using piranha solution followed by a cleaning cycle in a rinser/dryer apparatus.

Figure 2:
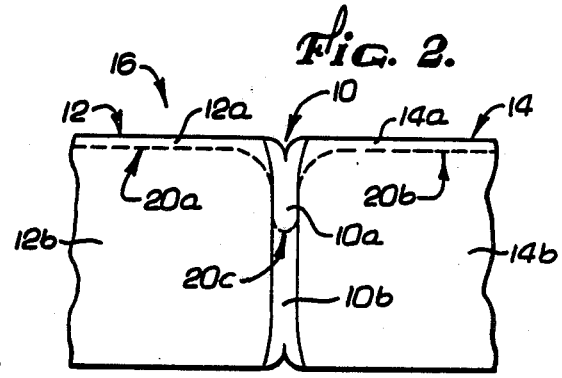
FIG. 2 shows the p-n junction of a semicrystalline wafer after doping.

In order to form an n-p junction the wafer 16 is doped with $POCl_3$ on one side of the wafer to provide a source of n type donor ions. The other side of the wafer 16 is doped with aluminum for the source of p type acceptor ions. The aluminum is silk screened in paste form onto the back of the wafer 16 and is fired in on a conveyer furnace. In this manner, a p-n junction 20a is formed between an n+ region 12a and a p+ region 12b of the grain region 12 as shown in FIG. 2. Similarly a p-n junction 20b is formed between the n+ and p+ regions 14a and 14b, respectively of the grain area 14. As previously mentioned, the grain boundary 10 is more susceptible to the doping so that the boundary 10 is doped much deeper and to a greater extent, as indicated by the p-n junction 20c between the n+ and p+ regions 10a and 10b, respectively, of the grain boundary 10. The excess aluminum is chemically removed and a light buffer etch removes the phosphor doped glass.

The regions 12a and 12b of the grain area 12 and the regions 14a and 14b of the grain area 14 are the active regions of the semicrystalline wafer 16. Radiation incident upon the active regions 12a, 12b, 14a and 14b generates hole and electron carriers which diffuse to their respective terminals (not shown) to produce an electric current. The grain boundary 10, on the other hand, is an inactive region and can act as a current sink and a current short to the active regions in the following manner. Since the grain boundary 10 is doped to a greater extent than the grain areas 12 and 14, the highly doped region 10a of the grain boundary 10 can be highly conductive and act as a current short across the p-n junctions 20a and 20b, respectively, in prior art devices. Furthermore, since the grain boundary 10 is a discontinuity between the crystalline orientation of the grain area 12 and the orientation of the grain area 14, bend bonds are formed which are not tetrahedrally coordinated. Hence, it takes less energy for electrons to recombine; therefore recombination is more likely in the grain boundary than in the active regions of the grain area. As a result, electrons generated in the active region may diffuse to the grain boundaries and recombine in prior art devices before they are collected by a terminal. In this manner, the grain boundary can act as a current sink.

In addition, if light is allowed to strike the grain boundary 10, carriers will be generated at the p-n junction 20c of the grain boundary between the regions 12b and 10a and also between the regions 14b and 10a. The generation of carriers at the p-n junction 20c will reduce the depletion region at the junction to in effect forward bias the p-n junction 20c. This will encourage the migration of carriers into the boundary region 10 from the active areas, where they can be lost by recombination.

In order to passivate the grain boundary 10 to prevent current shorting and sinking, while at the same time utilizing this inactive boundary area for a conductor network, the silicon wafer 16 is anisotropically etched while using a galvanic displacement reaction, which takes advantage of the anisotropic electrochemical behavior of semicrystalline silicon.

The anisotropic effect during the etching of silicon has been attributed to crystallographic parameters such as structure density and the accessibility of surface free bonds. The free bond density and etch rate for low index planes decrease for alkaline etching processes, for example, in the following sequence:

$$[100]>[110]>[111]$$

In a preferred embodiment, the displacement technique is based upon an electrochemical reaction between metal ions in a solution and the silicon surface without an external source of current. The grain boundary 10 of the doped semicrystalline wafer 16 may be etched while atoms of the grain boundary 10 are displaced by metallic atoms by immersing the semicrystalline wafer 16 in an aqueous solution containing an etching agent and a metal, such as fluorine ions and ions of copper or cobalt, respectively.

Anodic etching and cathodic metal deposition will occur adjacent to each other on the semicrystalline silicon. Since the various crystallographic planes react differently electrochemically, a certain minimum amount of energy, or energy threshold, is necessary to etch a particular crystallographic plane having a specific bond density. Preferential etching should occur if the energy supplied by a reaction is above the threshold of certain planes but less than the threshold of others. Furthermore, the half cell potential of the silicon surface reaction should be greater than that required to reduce the metal from the solution. Accordingly, metal ions should be selected for the displacement reaction having a reduction potential which will preferentially replace the silicon atoms in the grain boundary 10 over the silicon in the grain areas such as the grain areas 12 and 14.

The electromotive force for the displacement of silicon by copper ions is insufficient to displace silicon in the [111] direction. A fast etch rate on the Wacker semi-crystalline silicon material has been obtained with solutions containing one mole per liter of copper nitrate and four moles per liter of ammonium fluoride at room temperature. Copper fluoride is poorly soluble in water, and most of the copper will precipitate as $C_uF_2$ during the mixing of the solutions. This precipitate can act as a continuous source of copper and fluoride ions as the solution is being depleted, per the reaction:

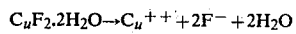

$$C_uF_2 \cdot 2H_2O \rightarrow C_u^{++} + 2F^- + 2H_2O$$

Figure 3:
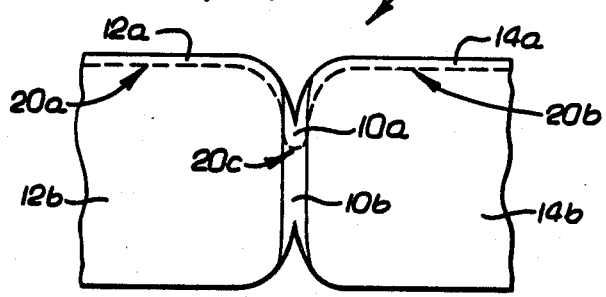
FIG. 3 illustrates an anisotropic etching of a grain boundary of a semicrystalline solar cell of the present invention.

FIG. 3 shows a cross-section of the wafer 16 after the etching and displacement of the atoms of the grain boundary 10 by the metallic ions. The combining of the metallic ions with the ununited bonds on the grain surfaces serves to reduce the occurrence of minority carrier recombination. The displacing metallic ion removes the acceptor/donor-like states in the forbidden band of the crystalline structure and helps to reduce the atoms which are not tetrahedrally coordinated. In this manner, the grain boundary 10 is passivated to reduce current sinking and provide an improved open circuit voltage.

Figure 4:
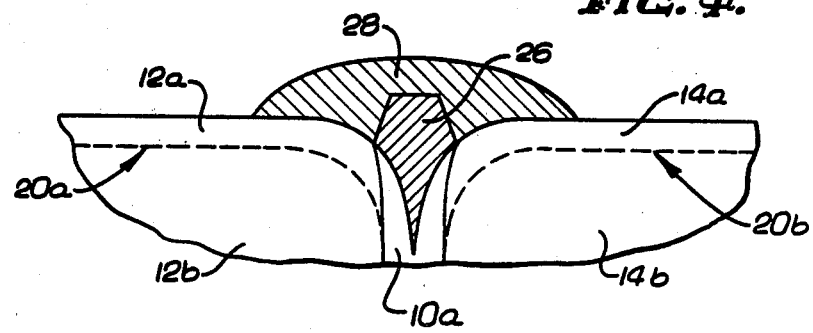
FIG. 4 is a partial cross-sectional view of the cell of FIG. 5 along the line 4—4 and shows the grain boundary of the cell of FIG. 3 after metal has been galvanically deposited and electrodeposited on the etched boundary.

Copper has been selected for the displacing ion in the illustrated embodiment; however, ions such as cobalt and other low energy half-cell couples may also be used. The copper which has displaced the surface layer of the silicon atoms in the grain boundary 10 has additional electrolytic metal such as copper or silver deposited over it as indicated at 26 in FIG. 4 to improve the conductivity of the metallized boundary.

It is apparent from the foregoing that the above described electrochemical displacement reaction automatically defines the grain boundaries of the semicrystalline material with a metal pattern covering the etched surface of the grain boundaries. This self-defined metal pattern of the grain boundaries of the wafer may be utilized to electrodeposit additional metal such as silver or copper by standard electroplating techniques onto the metal boundary pattern. This second layer of deposited metal is indicated at 28 in FIG. 4 and provides additional conducting area to collect the carriers diffusing from the active regions of the grain areas 12 and 14 before they can recombine in the grain boundary 10. The amount of additional metal deposited may vary depending upon the grain size of a particular material. If the semicrystalline material being used has large grain areas (exceeding one square centimeter), a thicker metallic layer should be deposited on the already defined pattern to compensate for the larger current density generated by the larger grain areas.

An additional advantage is the shadowing effect provided by the metal deposited over the grain boundary. The metallized boundary prevents light from entering the p-n junction 20c in the grain boundary 10. As a result, carriers are not generated in the grain boundary 10 by incident light and the depletion region around the p-n junction 20c is not reduced. This in effect reverse biases the p-n junction 20c to inhibit carriers from the grain areas from crossing into and recombining in the grain boundary 10. Thus, the shadowing effect of the metal deposited over the grain boundary further passivates the grain boundary.

Upon completion of the electroplating of the additional metal, silicon nitride may be deposited on the wafer in a plasma depositor at a temperature of 200°–250° C. to a thickness of approximately 800–850 angstroms to create an anti-reflection coating, as is well known in the art. In addition, this step acts as a sintering cycle for the metallization layer. Furthermore, since the nitride covers the entire surface of the wafer 16, the nitride layer provides a protective layer for the fine line metallization at the periphery of the grain areas.

Figure 5:
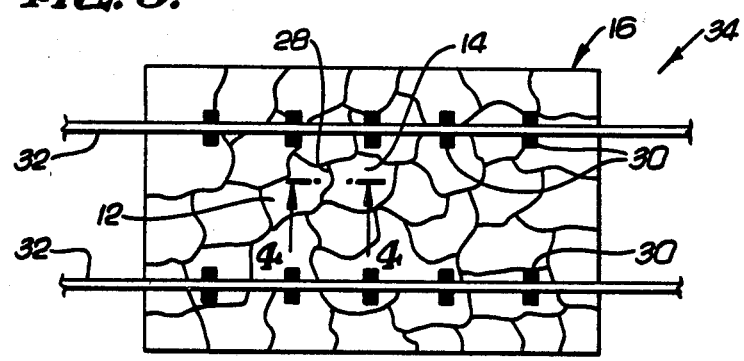
FIG. 5 is a planar view of a semicrystalline solar cell of the present invention.

As shown in FIG. 5, the metallized grain boundaries between the various grain areas, such as grain boundary 10 between grain areas 12 and 14, form a continuous conductor network over the surface of the wafer 16 to collect the generated electricity. Furthermore, the metallization layer over the grain boundaries serves to passivate the boundaries to prevent current sinking and shorting.

To facilitate the collection of the generated current from the various grain areas, a plurality of conductive pads indicated at 30 are statistically distributed over the surface of the wafer 16. The pads 30 are screened onto the nitride layer and sintered through the nitride to make contact with the upper metallization pattern 28 underneath the nitride layer. A pair of ribbon wires 32 are then bonded to the pads 30 to interconnect the pads and tap the current from each of the grain areas as shown in FIG. 5. Finally, the junctions at the edges of the wafer 16 may be separated by either laser trimming the edges or by using a diamond saw, as is well known in the art. A completed solar cell in accordance with the preferred embodiment of the present invention is indicated at 34.

From the foregoing, it is seen that a semicrystalline solar cell is provided which has a self-defined metallization pattern which utilizes the inactive areas of the wafer 16 to collect the electricity generated by the active grain areas. Furthermore, only 2 to 3% of the surface area of the wafer 16 in the preferred embodiment is shadowed by the main bus wires 32 as compared to the much larger active area typically shadowed by conventional grid networks. In addition, since the perimeters of the grain areas are metallized on all sides as shown in FIG. 5, the diffusion length required before the carriers are collected is generally smaller than with conventional grid networks. Accordingly, materials having a relatively low surface life-time may be used.

Further advantages of the present invention include the elimination of expensive masking or photoresist processes for fine line definition of current collection networks. Furthermore, natural passivation of the grain boundaries is obtained due to the non-illumination or shielding of the p-n junction within the grain boundaries. Semicrystalline silicon solar cells constructed in accordance with the preferred embodiment can also be expected to have higher current densities than those obtained with conventional processes due to the termination of the dangling bonds by the metal deposited at the grain boundaries. In addition, the above-described construction sequence is highly adaptable to large volume production of solar cells by automation.

It will, of course, be understood that modifications of the present invention, in its various aspects, will be apparent to those skilled in the art, some being apparent only after study, and other being merely matters of routine solar cell design. Other embodiments are also possible with their specific designs depending upon the particular application. As such, the scope of the invention should not be limited by the particular embodiment herein described, but should be defined only by the appended claims and equivalents thereof.

I claim:

1. A solar cell comprising: a semicrystalline structure having a plurality of grain areas of differing crystalline orientation and grain boundaries separating the differing grain areas; a p-n junction formed in the semicrystalline structure; and a conductive metallic region formed at the grain boundaries (a) for collecting generated carriers from the structure before the carriers recombine at the grain boundaries, and (b) for shielding the grain boundaries from light thereby to further passivate the grain boundaries, said metallic region being formed by anodic etching at the grain boundaries and cathodic displacement of atoms at the grain boundaries with metallic atoms.

2. The cell of claim 2 wherein the metallic region is formed by treating the grain boundaries with a solution of copper nitrate and ammonium fluoride.

3. The cell of claim 1 wherein there is deposited on said metallic region a relatively thicker metal layer to form a lower resistance current conducting path.

4. The cell of claim 3 wherein said relatively thicker metallic layer is electrodeposited on the metallic region.

5. The cell of claim 1 wherein said anodic etching is an anisotropic anodic etching process.

6. The cell of claim 5 wherein said anodic etching process is carried out with a solution of a suitably low reduction potential metal ion and a crystalline element removing anion.

7. A solar cell comprising: a semicrystalline structure having a plurality of grain areas of differing crystalline orientation and grain boundaries separating the differing grain areas; a p-n junction formed in the semicrystalline structure; and a conductive metallic region formed at the grain boundaries (a) for collecting generated carriers from the structure before the carriers recombine in the grain boundaries, and (b) for shielding the grain boundaries from light thereby to further passivate the grain boundaries; and a plurality of conductive pads distributed over the surface of the structure and electrically connected to the metallic region at the grain boundaries, and a bus electrically interconnecting the plurality of pads to collect the generated current.

8. The cell of claims 1 or 7 which further comprises a relatively thicker metallic layer deposited on said metal region to further facilitate collection of carriers before the carriers recombine in the boundaries and to further shield the boundaries and prevent the illumination of the boundaries thereby to further inhibit recombination in the boundaries.

9. A method of fabricating a solar cell utilizing a semicrystalline starting material having a plurality of grain areas of differing crystalline orientation separated by grain boundaries, said method comprising the steps of: doping the starting material with impurities to thereby form a p-n junction in the material; and providing a metallic region along the grain boundaries of the starting material to provide a conduction network to collect the generated current by anisotropic anodic etching at the grain boundaries and cathodic displacement of atoms at the the grain boundaries with metallic atoms, thereby also reducing recombination in the boundaries.

10. The method of claim 9 wherein the anodic etching and cathodic displacing steps comprise immersing the material in an aqueous solution of copper nitrate and ammonium fluoride.

11. The method of claim 9 wherein a relatively thicker metallic layer is deposited on said metallic region to further facilitate collection of carriers before the carriers recombine in the boundaries and to further shield the boundaries and prevent the illumination of the boundaries thereby to further inhibit recombination in the boundaries.

12. The method of claim 11 further comprising sintering the metallic layer.

13. The method of claim 11 further comprising placing conductive pads on the metallic layer and interconnecting the pads with a bus to facilitate the collection of generated current.

14. The method of claim 11 further comprising applying a transparent protective coating onto the light receiving surface of the material, screening conductive pads onto the protective coating; sintering the pads through the coating to make electrical contact with the metallic layer; and interconnecting the pads with a bus.

15. The method of claim 9 wherein said anisotropic etching and replacement process is carried out with a solution of a suitably low reduction potential metal ion and a crystalline element removing anion.

16. The method of claim 15 wherein said solution comprises copper nitrate and ammonium fluoride.

17. The method of claim 15 or 16 wherein said semicrystalline structure is a silicon semicrystalline structure.

18. A solar cell comprising: a wafer of semicrystalline silicon having a plurality of grain areas of differing crystalline orientation and etched grain boundaries separating the differing grain areas; a p-n junction diffused into the silicon wafer; a region of metal in the etched boundaries which has displaced silicon atoms in the boundaries to form a metallization pattern following the grain boundaries; and a thicker layer of metal deposited over the metallic region to form a metallization pattern following the grain boundaries to (a) collect generated carriers from the grain areas before the carriers recombine in the boundaries and (b) to shield the boundaries from illumination thereby to further inhibit carrier recombination in the boundaries; a light transparent layer forming a protective coating over the light-receiving side of the wafer; a plurality of conductive pads disposed on the coating and sintered through the coating making electrical contact with the layer of deposited metal; and a bus interconnecting the pads to conduct the current of carriers collected by the metallic region and layer.

19. A method of fabricating a solar cell utilizing a wafer of semicrystalline silicon having a plurality of grain areas of differing crystalline orientation separated by grain boundaries, said method comprising the steps of;

etching the wafer with sodium hydroxide to remove any damage from the wafer;

doping the wafer with $POCl_3$ on one side of the wafer and with aluminum on the other side to diffuse a p-n junction into the wafer;

immersing the wafer in an aqueous solution of copper nitrate and ammonium fluoride to anisotropically etch and displace atoms of each boundary to form a first layer of copper in the grain boundaries;

electroplating a second layer of metal onto the first layer of copper to cover the grain boundaries to provide a current collection network around the periphery of each of the grain areas and to shield the grain boundaries from illumination;

depositing a coating of silicon nitride on the wafer to protect the wafer and metallic layers;

screening conductive pads onto the silicon nitride coating;

sintering the pads through the coating to make electrical contact with the metallic layer covering the grain boundaries; and interconnecting the pads with a bus wire to collect the generated current.

20. A method of fabricating a solar cell utilizing semicrystalline starting material having a plurality of grain areas of differing crystalline orientation separated by grain boundaries, said method comprising the steps of:

doping the starting material with impurities to thereby form p-n junctions in the grain areas;

preferentially etching the starting material at the grain boundaries and selectively providing metal at the etched areas.

21. A method of fabricating a photovoltaic solar panel comprising:

providing an extensive layer of polycrystalline semiconductor material, the grains in said material having one statistically predominant orientation, forming p-n junctions within a substantial proportion of the grains of said layer material, etching said polycrystalline layer with an etchant that preferentially etches the grain orientations facing the grain boundaries of said layer, and selectively providing metallization over said preferentially etched boundaries, said metallization acting as a conductor for current collection from the p-n junctions of said grains.

22. The method of claim 21 in which said etchant also contains metal ions which combine with ununited bonds on boundary-adjacent grains.

* * * * *